US008620056B2

(12) United States Patent
Bystrov et al.

(10) Patent No.: US 8,620,056 B2
(45) Date of Patent: Dec. 31, 2013

(54) METHOD, AN APPARATUS, A SYSTEM AND A COMPUTER PROGRAM FOR TRANSFERRING SCAN GEOMETRY BETWEEN SUBSEQUENT SCANS

(75) Inventors: Daniel Bystrov, Hamburg (DE); Vladimir Pekar, Hamburg (DE); Stewart Young, Hamburg (DE); Cornelis Johannes Fransiscus Maria Bergmans, Eindhoven (NL); Arianne Van Muiswinkel, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 1143 days.

(21) Appl. No.: 12/307,620

(22) PCT Filed: Jun. 28, 2007

(86) PCT No.: PCT/IB2007/052505
§ 371 (c)(1),
(2), (4) Date: Jan. 6, 2009

(87) PCT Pub. No.: WO2008/007281
PCT Pub. Date: Jan. 17, 2008

(65) Prior Publication Data
US 2009/0208105 A1    Aug. 20, 2009

(30) Foreign Application Priority Data
Jul. 6, 2006 (EP) .................................... 06116706

(51) Int. Cl.
*G06K 9/00* (2006.01)
*G01V 3/00* (2006.01)
*A61B 5/05* (2006.01)

(52) U.S. Cl.
USPC ........................... 382/132; 324/307; 600/410

(58) Field of Classification Search
USPC ................... 382/132, 128; 324/307; 600/410
See application file for complete search history.

(56) References Cited

U.S. PATENT DOCUMENTS 6,396,266 B1 * 5/2002 Debbins et al. ............... 324/307
7,561,728 B2 * 7/2009 Abufadel et al. ............. 382/132
(Continued)

FOREIGN PATENT DOCUMENTS

WO         02091924 A1    11/2002
WO    WO 2004052206 A1 *  6/2004
(Continued)

OTHER PUBLICATIONS

Weiss, K. L., et al.; Automated Spine Survey Iterative Scan Technique; 2006; Radiology; 239(1)255-262.
(Continued)

*Primary Examiner* — Wenpeng Chen

(57) ABSTRACT

A method, an apparatus and a computer program for transferring scan geometry between a first region and a second region, similar to the first region includes identifying the first and second regions in an overview image, followed by determining of the first scan geometry corresponding to the first region. Then, the first scan geometry is transferred into the second scan geometry corresponding to the second region using information on geometrical correspondence between the first and second regions. The transferring includes establishing corresponding mappings between similar regions and their respective scan geometries.

20 Claims, 4 Drawing Sheets

(56) References Cited

U.S. PATENT DOCUMENTS

| | | | |
|---|---|---|---|
| 7,684,604 B2 * | 3/2010 | Bystrov et al. | 382/131 |
| 7,804,986 B2 * | 9/2010 | Lai et al. | 382/128 |
| 7,903,825 B1 * | 3/2011 | Melanson | 381/57 |
| 7,903,852 B2 * | 3/2011 | Springorum et al. | 382/128 |
| 2002/0151785 A1 * | 10/2002 | Mueller et al. | 600/410 |
| 2002/0198447 A1 * | 12/2002 | Van Muiswinkel et al. | 600/410 |
| 2005/0154292 A1 | 7/2005 | Tank | |
| 2005/0267352 A1 * | 12/2005 | Biglieri et al. | 600/410 |
| 2006/0173277 A1 * | 8/2006 | Elgort et al. | 600/410 |

FOREIGN PATENT DOCUMENTS

| | | |
|---|---|---|
| WO | 2006013499 A1 | 2/2006 |
| WO | WO 2006013499 A1 * | 2/2006 |
| WO | 2007096804 A1 | 8/2007 |

OTHER PUBLICATIONS

Young, S., et al.; Automated planning of MRI neuro scans; 2006; Medical Imaging SPIE; vol. 6144; pp. 1-8.

* cited by examiner

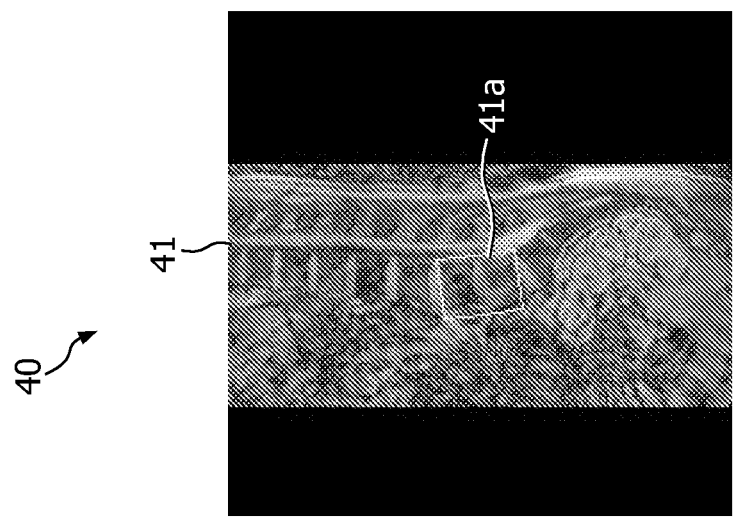
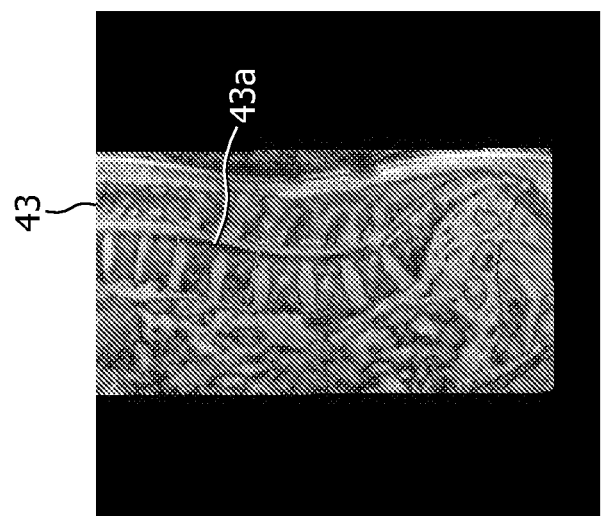
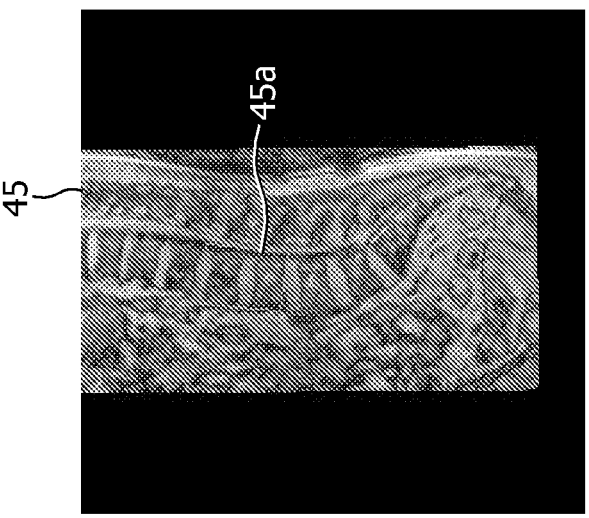
FIG. 4

METHOD, AN APPARATUS, A SYSTEM AND A COMPUTER PROGRAM FOR TRANSFERRING SCAN GEOMETRY BETWEEN SUBSEQUENT SCANS

FIELD OF THE INVENTION

The invention relates to a method for transferring scan geometry from a first scan to a second scan for similar regions.

The invention further relates to an apparatus for transferring scan geometry from a first scan to a second scan for similar regions.

The invention still further relates to a computer program for transferring scan geometry from a first scan to a second scan for similar regions.

A method as is set forth in the opening paragraph is known from U.S. Pat. No. 6,396,266 B1. The known method is operator-interactive and is applicable to data acquisitions using a magnetic resonance imaging apparatus. In the known method the operator is enabled to define a second imaging geometry by defining a suitable scan plane on an overview image for subsequent acquisition based on a previously defined scan plane corresponding to a previous acquisition. In this way the geometry information of a previously prescribed imaging volume is used as a starting point to prescribe imaging volume for a subsequent scan.

It is a disadvantage of the known method that it is operator driven and has limited operational speed.

DESCRIPTION OF THE INVENTION

It is an object of the invention to provide a method for transferring scan geometry, with an improved operational speed.

To this end the method according to the invention comprises the steps of:
 loading an overview scan of an object comprising a first region and a second region;
 identifying the first region and the second region in the overview scan;
 determining a first scan geometry corresponding to the first region;
 transferring the first scan geometry into the second scan geometry corresponding to the second region using information on geometrical correspondence between the first region and the second region.

The technical measure of the invention is based on the insight that by using a content information of the overview image, like a similarity between the first region and the second region, it is possible to substantially improve the speed of operation of the geometry transfer step, because said transformation is directly related to the geometrical correspondence between the regions in the overview scan. It is further noted that a possibility to transfer scan geometry from the first region to a multiple similar regions is contemplated as well. Additionally, the first scan geometry may consist of one or more samples, which may be manually adjusted by the user to fit into the overview scan. An example of a suitable sample comprises a scanning template of a standardized region of interest, like a brain, a heart, etc. Suitable example of constructing such templates is known from WO 2006/013499. It is further noted that similar regions may comprise corresponding organs, structures or parts thereof in a human body, like left/right knee, arm, lung, kidney, different vertebrae in the column, etc.

In an embodiment of the method according to the invention the step of identifying the first region and the second region is performed automatically by means of image segmentation.

By automating this operation a further increase of operational speed of the method according to the invention is ensured. Suitable examples of automatic region identification by means of image segmentation comprise automatic contouring, for example based on pixel values in the image, or automatic segmentation of structures based on image landmarks. Alternatively, supplementary data, like type of imaging protocol, notably made available in the patient data file, may be used to automatically identify the first region. It is noted that such identification may comprise an automatic delineation of region of interest, notably drawn using knowledge of a usual position of the sought region in the image due to the fact that standard imaging protocols will result in similar positions of similar regions of the patient within the overview image.

In a further embodiment of the method according to the invention the step of determining the first scan geometry is performed by analyzing preceding scans of similar regions.

Geometry, notably for a MR-can planning, depends on specific anatomical structures. The relevance of different anatomical structures can, preferably, automatically be analyzed using several geometry samples for different patients, but for the same anatomy. If there is a corresponding anatomy it is possible to simultaneously learn the geometry dependency from samples for all corresponding structures. By analyzing previous scans for corresponding regions a first educated guess for actual scanning geometry can be provided. This embodiment further improves operational speed of geometry transfer step.

In a still further embodiment of the invention the first scan geometry is determined based on a pre-stored model.

This feature is based on the insight that dependencies between position and orientation of certain, notably frequently used, regions in the image and corresponding imaging geometries can be memorized in a suitable database and can be subjected to analysis for defining suitable templates of imaging geometries which can subsequently be used for planning new scans. In general such templates are conceived to represent an averaged planning geometry, which can be automatically offered to the operator. The operator may then manually adjust parameters of the first imaging geometry fitting the actual region. Alternatively, the first imaging geometry may be obtained automatically starting from the template and using suitable landmarks in the image, which can be either provided by the operator, or can be found automatically, for example by means of suitable image segmentation.

In a still further embodiment of the method according to the invention the step of transferring comprises establishing corresponding mappings between similar regions and their respective scan geometries.

The correspondence mappings can be used to artificially generate anatomical samples as well as geometry samples for one anatomy from the other. For example the correspondence mapping between two anatomies A and B can be realized as a self-mapping C of the three-dimensional image space $I \in R_3$. If there is a sample $S_A$ (for example, a set of landmarks) for the anatomy A, the mapping C can be used to generate an artificial sample $C(S_A)$ of these landmarks for the anatomy B. Also a geometry sample $G_A$ for the anatomy A can be transferred to an artificial geometry sample of the anatomy B by applying the correspondence map C to the corners of the bounding box of this geometry. Use of bounding box for planning scan geometry falls within the scope of knowledge of a person skilled in the art. For transforming some symmetrically arranged regions, like left/right transformations, in addition to geometry transformation also a mirroring operator is used in addition to flipping the coordinate axis. Therefore, the mapping C' for a mapping geometry samples GA and the mapping of images or anatomical structures C can be different. The pair of mappings C and C' determine the correspondence and the transfer of geometries. With these mappings the samples in a geometry database can be pre-processed and planning samples can be mapped to the current anatomy.

In a still further embodiment of the method according to the invention a weighting factor is used to distinguish between samples of scan geometries and the first scan geometry for determining the second scan geometry.

In the learning phase is it found to be advantageous to differently weight artificially generated samples and samples from current anatomy. Preferably, samples of current anatomy are given higher relative weight.

These and other aspects of the invention will be apparent from and elucidated with reference to embodiments described hereinafter.

DESCRIPTION OF THE DRAWINGS

FIG. 4 presents an example of geometry transfer using the method according to the invention.

DESCRIPTION OF EMBODIMENTS

Figure 1:
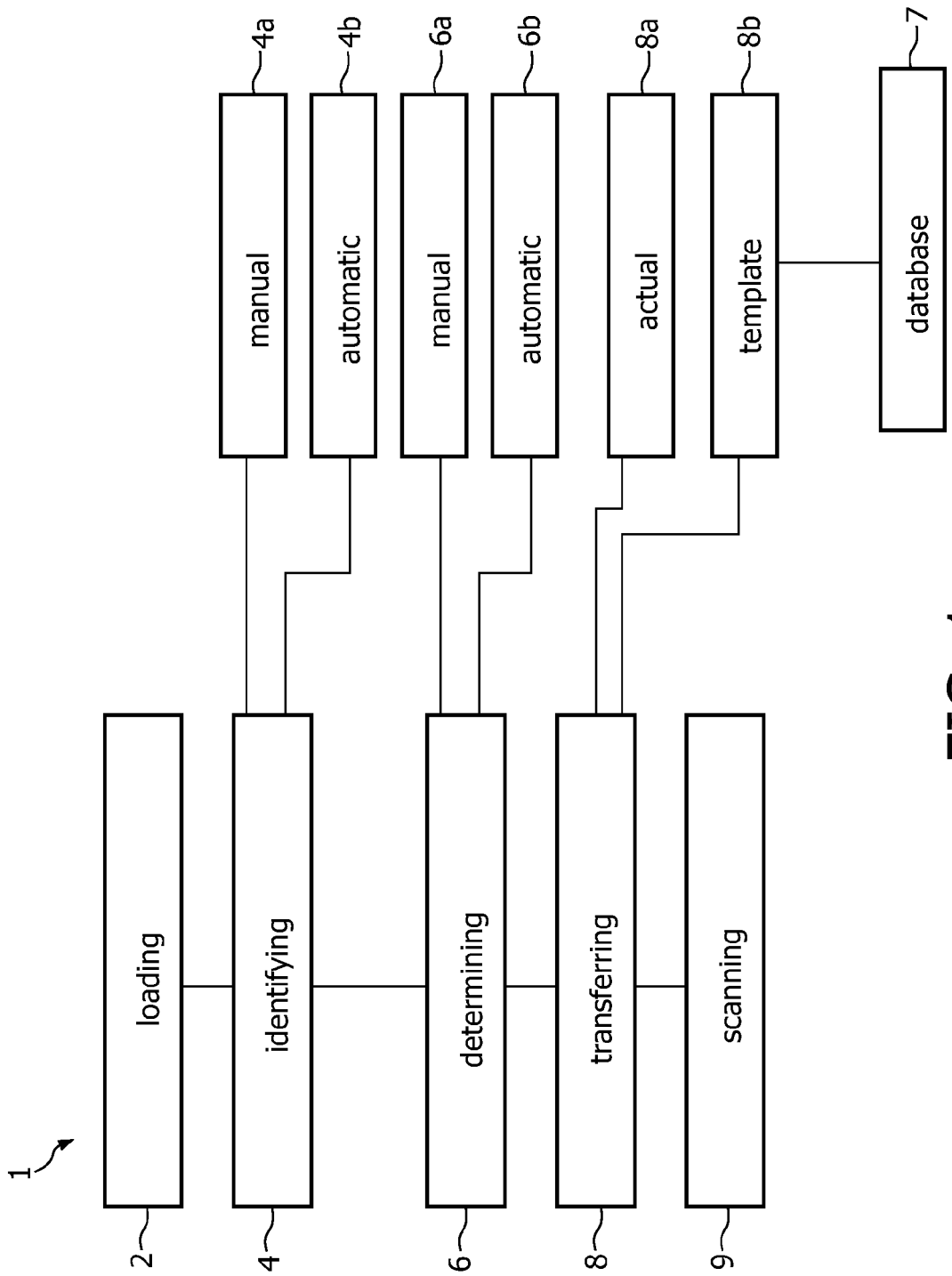
FIG. 1 presents a schematic view of an embodiment of the method according to the invention.

FIG. 1 presents a schematic view of an embodiment of the method according to the invention. In accordance with the method 1, at step 2 a suitable overview image comprising a first region and a second region is loaded into suitable image processing means. For magnetic resonance imaging, the overview image preferably comprises a survey image, which is usually acquired in three dimensions. The suitable image processing means may comprise a viewing station of the magnetic resonance apparatus, or any other display device. At step 4 of the method according to the invention the first region and the second region are being identified in the overview image. It is possible to perform such identification manually at step 4a. Alternatively or additionally, it is possible to identify the first region and the second region automatically at step 4b, for example by using automatic contouring or any other suitable image segmentation technique. At step 6 of the method according to the invention the first scan geometry corresponding to the first region is determined. This can be implemented manually at step 6a by providing suitable means for an operator for inputting relevant scanning information. Alternatively, this operation can be performed automatically at step 6b, for example by means of automatic analysis of preceding scans of similar regions. It is noted that in common data communication protocols, there is a possibility to couple alpha-numerical information to data. A tag referring to the region being scanned can be used to automatically detect executed scanning plans for regions identified with the same tag, like "knee", "cervical vertebrae", "brain" etc. When the first geometry corresponding to the first region is determined, the method 1 according to the invention proceeds to step 8 wherein the first scan geometry is being transferred into the second scan geometry corresponding to the second region, whereby information on geometrical correspondence between the first region and the second region is used. Preferably, the step of transferring comprises establishing corresponding mappings between similar regions and their respective scan geometries.

The correspondence mappings can be used to artificially generate anatomical samples as well as geometry samples for one anatomy from the other. For example the correspondence mapping between two anatomies A and B can be realized as a self-mapping C of the three-dimensional image space $I \in R_3$. If there is a sample $S_A$ (for example, a set of landmarks) for the anatomy A, the mapping C can be used to generate an artificial sample $C(S_A)$ of these landmarks for the anatomy B. Also a geometry sample $G_A$ for the anatomy A can be transferred to an artificial geometry sample of the anatomy B by applying the correspondence map C to the corners of the bounding box of this geometry. Use of bounding box for planning scan geometry falls within the scope of knowledge of a person skilled in the art. For transforming some symmetrically arranged regions, like left/right transformations, in addition to geometry transformation also a mirroring operator is used in addition to flipping the coordinate axis. Therefore, the mapping C' for a mapping geometry samples $G_A$ and the mapping of images or anatomical structures C can be different. The pair of mappings C and C' determine the correspondence and the transfer of geometries. With these mappings the samples in a geometry database can be pre-processed and planning samples can be mapped to the current anatomy.

It is noted that for the step of transferring two alternatives are contemplated. First, it is possible to transfer just the actual geometry using only information on the actual first scan geometry 8a. This option is applicable, for instance, when the first region has been just scanned and actual data on the first scan geometry is ready for use. Alternatively, it is possible to use a template 8b, which can be loaded from a database 7 of templates 8b. Also, a combination of these two options is possible, wherein the second scan geometry is obtained from combination of the actual information and information from the template. In this case, preferably, a weighting factor is used to distinguish between samples of scan geometries taken from the database and the actual first scan geometry. More preferably, the actual information is assigned a higher weight. When the second scan geometry is obtained, the method 1 according to the invention may proceed to the following step 9 for scanning the second region. Due to the fact that the scan geometries are transferred automatically using content information of the image, the speed of operation of the method according to the invention is improved with relation to the methods known from the prior art.

Figure 2:
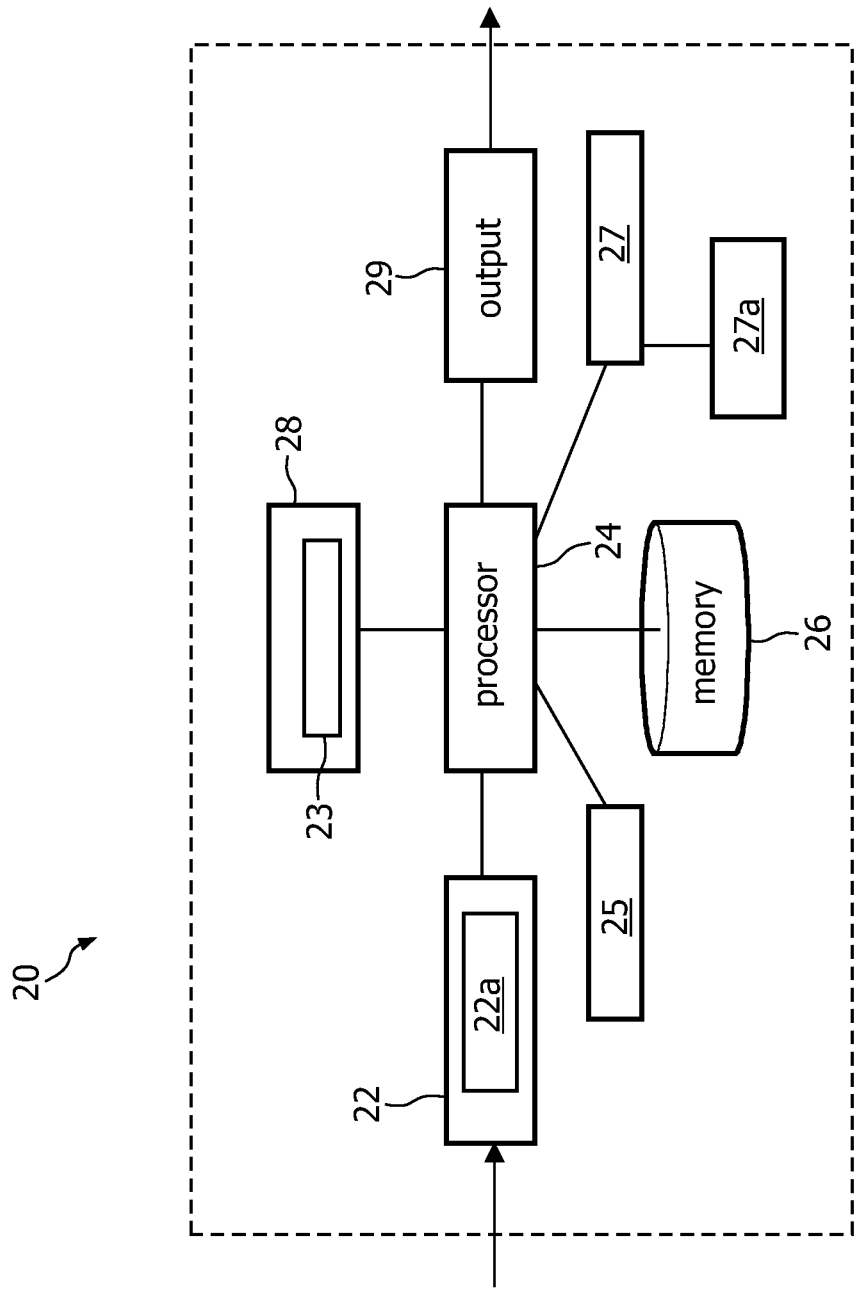
FIG. 2 presents a schematic view of an embodiment of an apparatus according to the invention.

FIG. 2 presents a schematic view of an embodiment of an apparatus according to the invention. The apparatus comprises a computer 20 with an input 22 for receiving a suitable source image data 22a, notably a diagnostic image of a patient, in any suitable form. For magnetic resonance imaging, such source image data comprises a survey scan of the patient. For example, the computer 20 may be involved in the acquisition of the source image data. In this case the image data may be acquired in an analogue form and converted using a suitable A/D converter to a digital form for further processing. The image data may also be received in a digital form, e.g. through direct acquisition in a digital form or via a computer network after having been acquired by a remote computer/medical instrument. The core of the computer 20 is formed by a processor 24 which is arranged for identifying regions in the overview scan. The processor 24 preferably runs a suitable computer routine 25 for this purpose. The computer 20 comprises a storage unit 28 arranged to store any suitable routines to be accessed by the processor during its operation. The computer 20 further comprises a working memory 26, typically based on RAM. The storage unit 28 can be used for storing the image data (or parts of it) when not being processed, and for storing operations on the image data and any other suitable supplementary information, like a weighting factor 23 to be used for distinguishing between samples and actual data. The working memory 26 typically holds the (parts of) image data being processed and the instructions for the suitable image processing means used for processing parts of the image data.

The processor 24 is further arranged to determine a first scan geometry corresponding to the first region. Preferably, a suitable image segmentation routine 27 is used, notably in the form of software. The processor 24 is still further arranged to transfer the first scan geometry into the second scan geometry corresponding to the second region using information on geometrical correspondence between the first region and the second region. Preferably, this feature is implemented using suitable software 27a, which produces sought results when being initiated by the processor. Preferably, the computer 20 comprises an output 29 which is suitably arranged to provide results of the transfer of the scan geometry. Advantageously, the output 29 is arranged to write suitable data into computer readable file.

Figure 3:
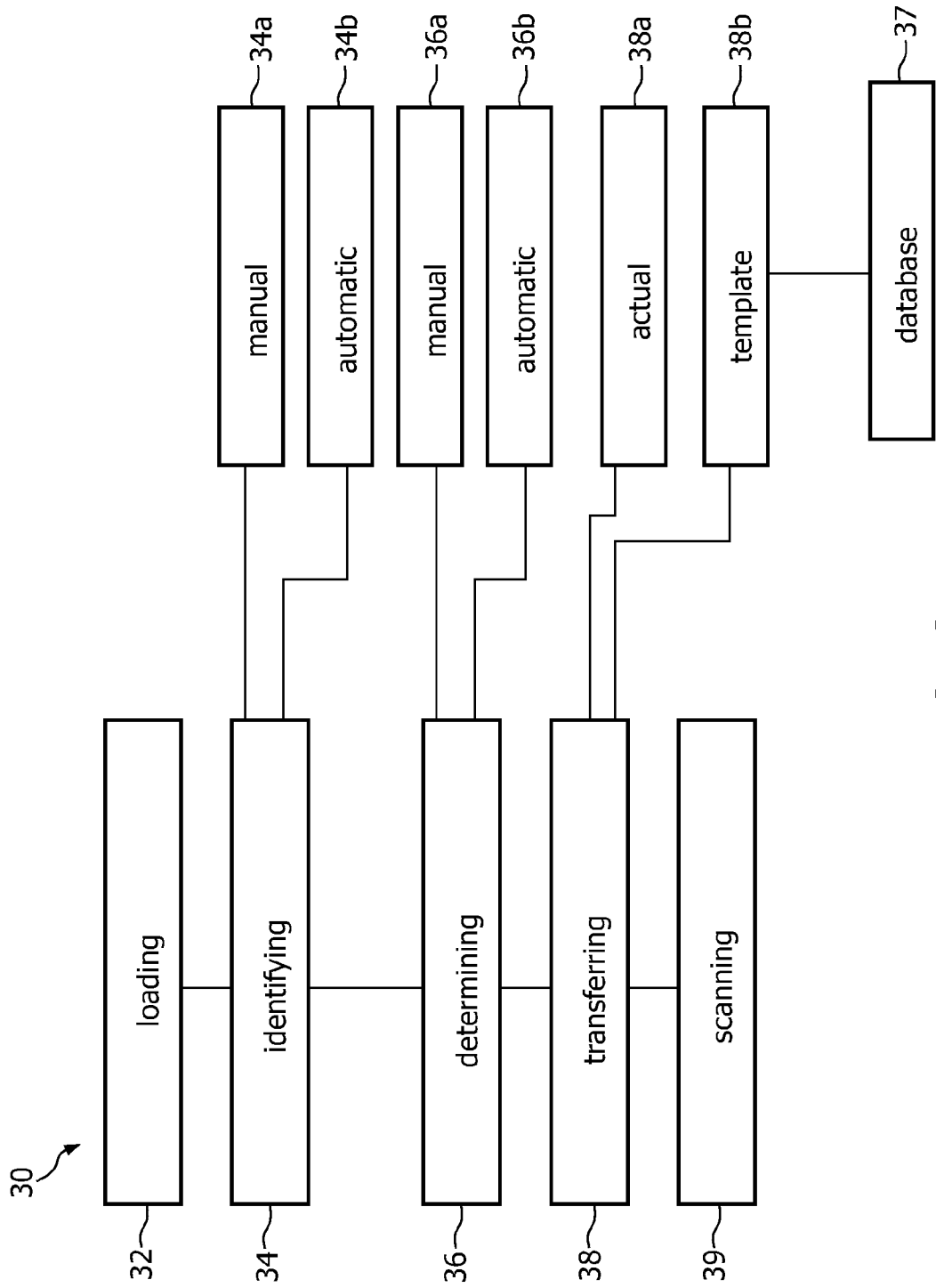
FIG. 3 presents a schematic view of an embodiment of a computer program according to the invention.

FIG. 3 presents a schematic view of an embodiment of a computer program according to the invention. In accordance with the invention, the computer program 30 comprises an instruction 32 for causing a processor to load a suitable overview image comprising a first region and a second region is loaded into suitable image processing means. For magnetic resonance imaging, the overview image preferably comprises a survey image, which is usually acquired in three dimensions. The suitable image processing means may comprise a viewing station of the magnetic resonance apparatus, or any other display device. Pursuant to instruction 34 of the computer program according to the invention the first region and the second region are being identified in the overview image. It is possible to perform such identification manually following user data input 34a. In this case the computer program writes input data into a suitable file. Alternatively or additionally, it is possible to identify the first region and the second region automatically pursuant to instruction 34b, for example by using automatic contouring or any other suitable image segmentation technique. In accordance with instruction 36 of the computer program according to the invention, the first scan geometry corresponding to the first region is determined. This can be implemented manually at step 36a by memorizing input data provided by an operator for inputting relevant scanning information. Alternatively, this operation can be performed automatically pursuant to instruction 36b, for example by means of automatic analysis of preceding scans of similar regions. It is noted that in common data communication protocols, there is a possibility to couple alpha-numerical information to data. A tag referring to the region being scanned can be used to automatically detect executed scanning plans for regions identified with the same tag, like "knee", "cervical vertebrae", "brain" etc. When the first geometry corresponding to the first region is determined, the computer program 30 proceeds to instruction 38 whereat the first scan geometry is being transferred into the second scan geometry corresponding to the second region, whereby information on geometrical correspondence between the first region and the second region is used. Preferably, the step of transferring comprises establishing corresponding mappings between similar regions and their respective scan geometries.

The correspondence mappings can be used to artificially generate anatomical samples as well as geometry samples for one anatomy from the other. For example the correspondence mapping between two anatomies A and B can be realized as a self-mapping C of the three-dimensional image space $I \in R_3$. If there is a sample $S_A$ (for example, a set of landmarks) for the anatomy A, the mapping C can be used to generate an artificial sample $C(S_A)$ of these landmarks for the anatomy B. Also a geometry sample $G_A$ for the anatomy A can be transferred to an artificial geometry sample of the anatomy B by applying the correspondence map C to the corners of the bounding box of this geometry. Use of bounding box for planning scan geometry falls within the scope of knowledge of a person skilled in the art. For transforming some symmetrically arranged regions, like left/right transformations, in addition to geometry transformation also a mirroring operator is used in addition to flipping the coordinate axis. Therefore, the mapping C' for a mapping geometry samples $G_A$ and the mapping of images or anatomical structures C can be different. The pair of mappings C and C' determine the correspondence and the transfer of geometries. With these mappings the samples in a geometry database can be pre-processed and planning samples can be mapped to the current anatomy.

It is noted that for the step of transferring two alternatives are contemplated. First, it is possible to transfer just the actual geometry using only information on the actual first scan geometry 38a. This option is applicable, for instance, when the first region has been just scanned and actual data on the first scan geometry is ready for use. Alternatively, it is possible to use a template 38b, which can be loaded from a database 37 of templates 38b. Also, a combination of these two options is possible, wherein the second scan geometry is obtained from combination of the actual information and information from the template. In this case, preferably, a weighting factor is used to distinguish between samples of scan geometries taken from the database and the actual first scan geometry. More preferably, the actual information is assigned a higher weight. When the second scan geometry is obtained, the computer program 30 may proceed to the following step 39 for scanning the second region. Due to the fact that the scan geometries are transferred automatically using content information of the image, the speed of operation of the method according to the invention is improved with relation to the implementations known from the prior art.

FIG. 4 presents an example of geometry transfer using the method according to the invention. In this exemplified embodiment scan geometry is transferred for human vertebrae. First, at step 41 the first scan geometry is learned for vertebrae L4/5, it being schematically denoted by block 41a. Subsequently, knowing the geometrical correspondence between further vertebrae and the section L4/L5, the second scan geometry is successfully transferred at step 43 for vertebrae L1/L2, block 43a and for vertebrae L2/L3, block 45a at step 45.

While the invention has been illustrated and described in detail in the drawings and foregoing description, such illustration and description are to be considered illustrative or exemplary and not restrictive; the invention is not limited to the disclosed embodiments.

The invention claimed is:

1. A method for transferring scan geometry from a first scan to a second scan for similar regions, the method comprising the acts of:
    loading an overview scan of an object comprising a first region and a second region;
    identifying the first region and the second region in the overview scan;
    determining a first scan geometry corresponding to the first region;

transferring by a processor the first scan geometry into a second scan geometry corresponding to the second region using information on geometrical correspondence between the first region and the second region, wherein a weighting factor is used to distinguish between samples of scan geometries and the first scan geometry for determining the second scan geometry.

2. The method according to claim 1, wherein the act of identifying the first region and the second region is performed automatically by image segmentation of the overview scan.

3. The method according to claim 1, wherein the act of determining the first scan geometry is performed by analyzing preceding scans of similar regions.

4. The method according to claim 1, wherein the first scan geometry is determined based on a pre-stored model.

5. The method according to claim 1, wherein the act of transferring comprises establishing correspondence mappings between similar regions and their respective scan geometries.

6. The method according to claim 5, wherein the method further comprises a preparatory act of:

pre-processing a geometry database comprising a plurality of regions with corresponding scan geometries for establishing samples of the scan geometry.

7. The method of claim 1, wherein the samples of scan geometries are obtained from a database, and wherein the first scan geometry is assigned a higher weight than weights assigned to the samples.

8. An apparatus for transferring scan geometry from a first scan to a second scan for similar regions, the system comprising:

an input for loading an overview scan of an object comprising a first region and a second region;

a processor configured for:
identifying the first region and the second region in the overview scan;
determining a first scan geometry corresponding to the first region;
automatically transferring without user intervention the first scan geometry into a second scan geometry corresponding to the second region using information on geometrical correspondence between the first region and the second region of the overview scan; and
using a weighting factor to distinguish between samples of scan geometries and the first scan geometry for determining the second scan geometry.

9. An image acquisition system, comprising an apparatus with an imaging module for obtaining scan data, said system further comprising an apparatus according to claim 8.

10. The apparatus of claim 8, wherein the samples of scan geometries are obtained from a database, and wherein the processor assigns the first scan geometry a higher weight than weights of the samples.

11. The apparatus of claim 8, wherein the processor is configured to identify the first region and the second region by image segmentation of the overview scan.

12. The apparatus of claim 8, wherein the processor is configured to determine the first scan geometry by analyzing preceding scans of similar regions.

13. The apparatus of claim 8, wherein the processor is configured to determine the first scan geometry based on a pre-stored model.

14. The apparatus of claim 8, wherein the processor is configured to perform the transferring by establishing correspondence mappings between similar regions and their respective scan geometries.

15. The apparatus of claim 14, wherein the processor is further configured to pre-process a geometry database comprising a plurality of regions with corresponding scan geometries for establishing samples of the scan geometry.

16. A non-transitory computer readable medium embodying computer instructions which, when executed by a processor, configure the processor to perform the acts of:

identifying the first region and the second region in the overview scan;
determining a first scan geometry corresponding to the first region;
automatically transferring without user intervention the first scan geometry into the second scan geometry corresponding to the second region using information on geometrical correspondence between the first region and the second region of the overview scan; and
using a weighting factor to distinguish between samples of scan geometries and the first scan geometry for determining the second scan geometry.

17. The non-transitory computer readable medium of claim 16, wherein the identifying act comprises segmentation of the overview scan.

18. The non-transitory computer readable medium of claim 16, wherein the determining act comprises analyzing preceding scans of similar regions.

19. The non-transitory computer readable medium of claim 16, wherein the first scan geometry is determined based on a pre-stored model.

20. The non-transitory computer readable medium of claim 16, wherein the transferring act comprises establishing correspondence mappings between similar regions and their respective scan geometries.

* * * * *